United States Patent [19]

Le Quéau

[11] Patent Number: 4,799,025
[45] Date of Patent: Jan. 17, 1989

[54] DIGITAL FM DEMODULATOR USING DIGITAL QUADRATURE FILTER

[75] Inventor: Marcel Le Quéau, Ozoir-La-Ferriere, France

[73] Assignee: U.S. Philips Corporation, New York, N.Y.

[21] Appl. No.: 102,812

[22] Filed: Sep. 21, 1987

Related U.S. Application Data

[63] Continuation of Ser. No. 876,323, Jun. 19, 1986, abandoned.

[30] Foreign Application Priority Data

Jun. 21, 1985 [FR] France ................. 85 09491

[51] Int. Cl.$^4$ ............................................ H03K 9/06
[52] U.S. Cl. ................................. 329/107; 329/145; 375/80; 375/96; 375/99
[58] Field of Search ............ 329/104, 105, 107, 110, 329/126, 145; 375/78, 80, 82, 94, 96, 99

[56] References Cited

U.S. PATENT DOCUMENTS

| | | | |
|---|---|---|---|
| 4,528,511 | 7/1985 | Smith | 329/145 X |
| 4,547,737 | 10/1985 | Gibson | 329/145 X |
| 4,567,442 | 1/1986 | Haussmann | 329/145 |

Primary Examiner—Siegfried H. Grimm
Attorney, Agent, or Firm—Jack Oisher; Steven R. Biren

[57] ABSTRACT

A frequency-modulated digital signal demodulator includes a digital quadrature filter having n elements arranged in cascade, each delaying the input signal by a value $T_E = 1/F_E$, where $F_E$ is the sampling frequency, a number of channels arranged in parallel with the cascade arrangement of delay elements, each channel having a multiplier for multiplying by a given coefficient, a first and a second summing circuit for summing the respective output signals of said multipliers, the output signals of the two summing circuits constituting the quadrature output signals of the filter and being referred to as reference and phase-shifted signals. At the output of the filter a circuit for calculating the instantaneous phase $\phi_n$ of successive signal samples is provided. In order to provide a demodulator with an improved threshold and with a digital quadrature filter having an identical amplitude-frequency response for the quadrature channels and, with a view to reducing the cost, a smaller number of electronic components than that in prior art arrangements is used. The demodulator according to the invention includes, in parallel with the circuit for calculating the instantaenous phase, a circuit for evaluating the signal-to-noise ratio which is provided with a control circuit for modifying the coefficients of the quadrature filter when said ratio drops below a given threshold.

5 Claims, 3 Drawing Sheets

DIGITAL FM DEMODULATOR USING DIGITAL QUADRATURE FILTER

This is a continuation of application Ser. No. 876,323 filed June 19, 1986 now abandoned.

BACKGROUND OF THE INVENTION

The invention relates to a frequency-modulated digital signal demodulator having a digital quadrature filter with n elements arranged in cascade, each delaying the input signal by a value $T_E = 1/F_E$ where $F_E$ is the sampling frequency. A number of channels are arranged in parallel with the cascade arrangement of delay elements, each channel having a multiplier for multiplying by a given coefficient, and a first and a second summing circuit for summing the respective output signals of said multipliers, the output signals of the two summing circuits constituting the quadrature output signals of the filter and being referred to as reference and phase-shifted signals, and, at the output of the filter, a circuit for calculating the instantaneous phase $\phi_n$ of successive signal samples.

An arrangement operating with a calculation circuit of this general type is described in U.S. Pat. No. 3956623.

SUMMARY OF THE INVENTION

The invention has for its object to provide a demodulator with an improved threshold and with a digital quadrature filter having an identical amplitude-frequency response for the quadrature channels and, with a view to reducing the cost, a smaller number of electronic components than that in prior art arrangements.

To this end a demodulator according to the invention is characterized in that it comprises, in parallel with the circuit for calculating the instantaneous phase, a circuit for evaluating the signal-to-noise ratio which is provided with a control circuit for modifying the coefficients of the quadrature filter when said ratio falls below a given threshold.

BRIEF DESCRIPTION OF THE DRAWING

The invention will now be described in greater detail with reference to the accompanying drawing, in which.

DESCRIPTION OF THE PREFERRED EMBODIMENTS

Figure 1:
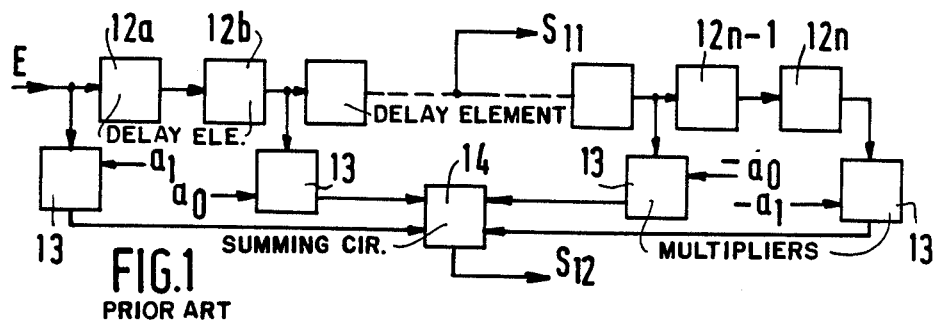
FIGS. 1 and 2 show quadrature filters of a known type.

The digital quadrature filter of the conventional structure shown in FIG. 1 has an input E to which an input signal is applied, n elements $12a$ to $12n$ arranged in series (n being even in this example) each delaying the input signal by a value of $T_E = 1/F_E$ where $F_E$ is the sampling period, $(n/2)+1$ channels arranged in parallel and regularly spaced along the series of delay elements and each comprising a multiplier 13 for multiplying by coefficients which in this case are pairwise equal in absolute value and have opposite signs ($a_1$, $a_0$, $-a_0$, $-a_1$, respectively) and a summing circuit 14 for summing output signals of these $(n/2)+1$ channels. A connection provided between the $(n/2)$nd and the $(n/2+1)$st delay element provides a reference output $S_{11}$ and the output of the summing circuit 14 constitutes an output $S_{12}$ delivering an output signal being phase-shifted over $\pi/2$ radians between the frequency 0 and the mean value of the sampling frequency with respect to an output signal at the output $S_{11}$.

Figure 2:
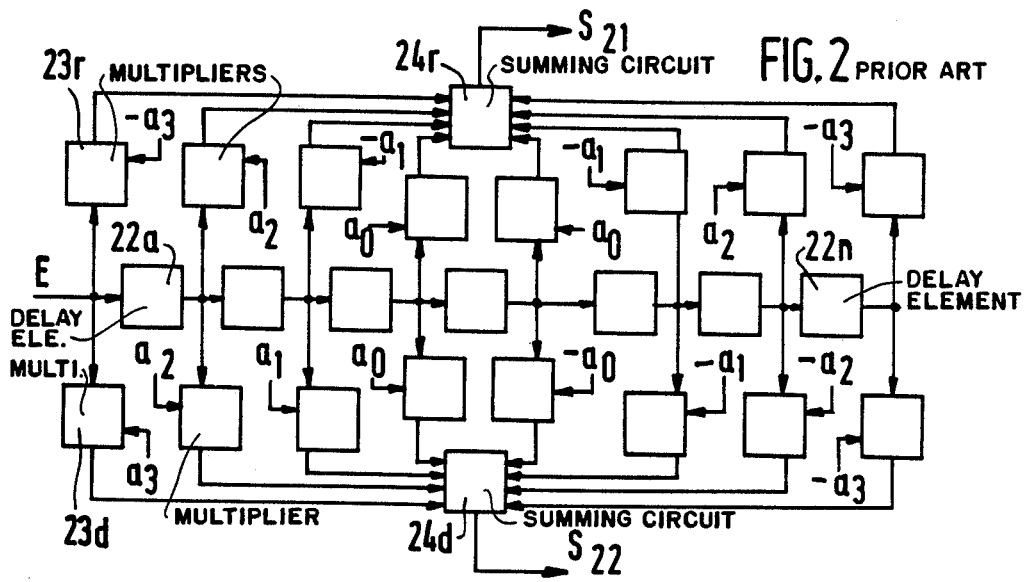

FIG. 2 shows the general principle of a filter; which at outputs $S_{21}$ and $S_{22}$ delivers output signals mutually shifted over $+\pi/2$ radians in phase between the frequency 0 and the mean value of the sampling frequency but with a shorter pulse response. In the embodiment shown the filter comprises seven delay elements $22a$ to $22n$ arranged in series, (n+1) first channels arranged in parallel and leading to the reference output $S_{21}$ via (n+1) multipliers $23r$ (coefficients: $-a_3$, $a_2$, $-a_1$, $a_0$, $a_0$, $-a_1$, $a_2$, $-a_3$, also pairwise equal) and a summing circuit $24r$ and (n+1) second channels arranged in parallel and leading to the phase-shifted output $S_{22}$ via (n+1) multipliers $23d$ (coefficients: $a_3$, $a_2$, $a_1$, $a_0$, $-a_0$, $-a_1$, $-a_2$, $-a_3$, pairwise equal and mutually opposed) and a summing circuit $24d$.

Figure 3:
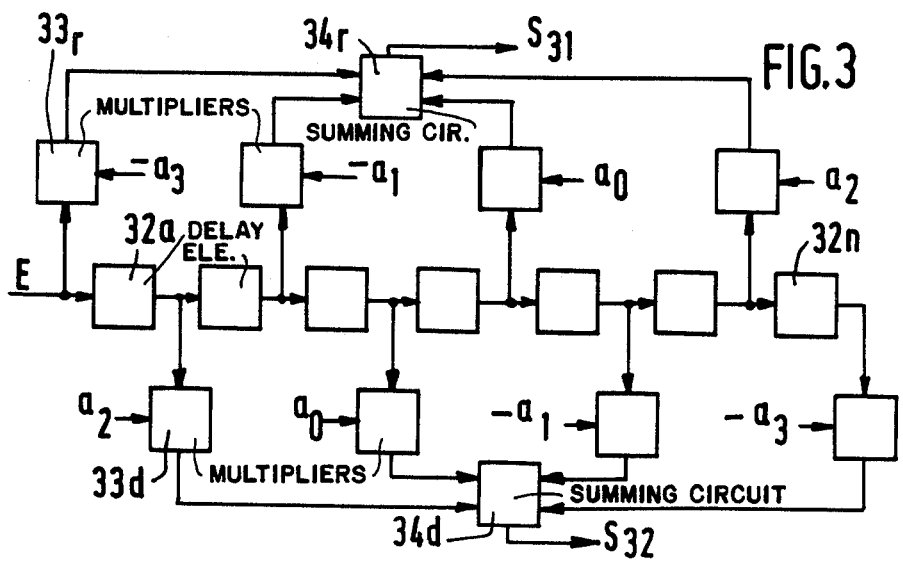
FIG. 3 shows a quadrature filter structure for use in the demodulator according to the invention.

The filter shown in FIG. 2 involves a considerable number of coefficients and the frequency response of the two phase-shifted channels is not identical in the entire Nyquist band. FIG. 3 shows a filter in which these drawbacks are obviated and it comprises:

an odd number of n delay elements $32a$ to $32n$ arranged in series (in this case 7);

a first set of (n+1)/2 channels arranged in parallel, the input signal which is delayed over $2T_E$, $4T_E$, ..., $(n-1)T_E$ being applied thereto;

(n+1)/2 multipliers $33r$ for multiplying with coefficients which are equal to $-a_3$, $-a_1$, $a_0$, $a_2$ in the embodiment shown;

a summing circuit $34r$ for summing the output signals of said multipliers, connected to the reference output $S_{31}$;

a second set of (n+1)/2 channels arranged in parallel, the signal delayed by $T_E$, $3T_E$, $5T_E$, ..., $nT_E$ being applied thereto;

(n+1)/2 multipliers $33d$ for multiplying with coefficients which are equal to $a_2$, $a_0$, $-a_1$, $-a_3$ in the embodiment shown, i.e. a sequence of coefficients in an order which is inverse to that of the sequence of the coefficients associated with the (n+1)/2 multipliers $33r$ of the first set of channels;

a summing circuit $34d$ for summing the output signals of said multipliers, connected to the phase-shifted output $s_{32}$ producing the reference output signal with a phase-shift of $+\pi/2$ radians.

If $X_a$, $X_b$, $X_c$ ..., $X_i$, ..., $X_n$, $X_{n+1}$ is referred to as the sequence of (n+1) consecutive samples of the input signal available at the terminals of the delay elements $32a$ to $32n$ ($X_a$ being the sample delayed n times, $X_b$ being delayed (n−1) times etcetera..., and $x_{n+1}$ being the sample present at the filter input), one of the two weighted summations effected for obtaining the two quadrature output signals is equal to:

$$c_0 X_a + c_2 X_c + c_4 X_e + \ldots + c_{(n-1)/2} X_{n-1} \quad (1)$$

and the other is equal to:

$$c_{(n-1)/2} X_b + c_{(n-5)/2} X_d + \ldots + c_2 X_{n-2} + c_0 X_n \quad (2)$$

Figure 4:
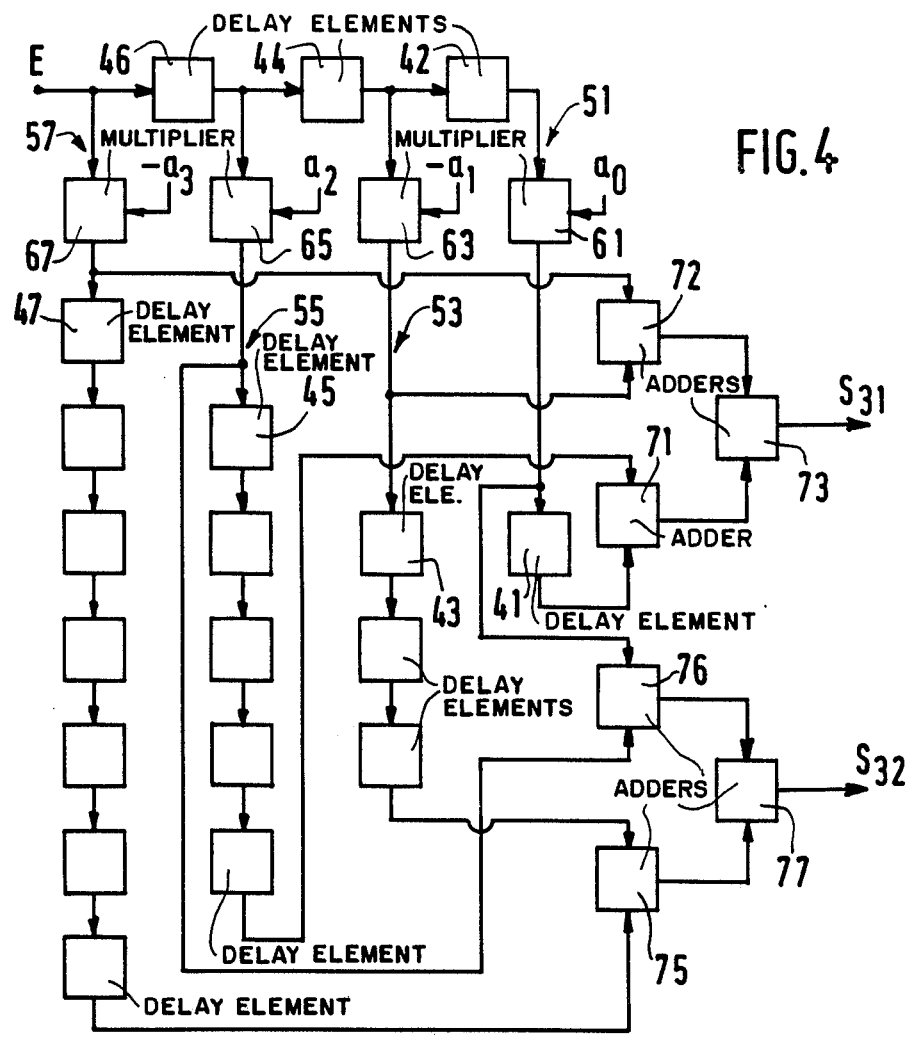
FIG. 4 shows a preferred embodiment of this filter structure.

FIG. 4 shows a possible embodiment of a filter as is illustrated in a principle circuit diagram in FIG. 3. This preferred embodiment comprises the delay elements 46, 44, 42 arranged in series and, connected to the terminals of these elements, four parallel channels 51, 53, 55, 57 comprising in series a first multiplier 61 for multiplying with the coefficient $a_0$ and a delay element 41, a second multiplier 63 for multiplying with the coefficient $-a_1$ and three delay elements 43, a third multiplier 65 for multiplying with the coefficient $a_2$ and five delay elements 45 and a fourth multiplier 67 for multiplying with the coefficient $-a_3$ and seven delay elements 47, respectively.

The outputs of the channel 51 and the channel 55 are connected to two inputs of an adder 71, while the outputs of the multipliers 63 and 67 are connected to two inputs of an adder 72 and the outputs of these two adders are connected to two inputs of an adder 73 whose output constitutes the reference output $S_{31}$. Similarly, the outputs of the channel 53 and the channel 57 are connected to two inputs of an adder 75, the outputs of the two multipliers 61 and 65 are connected to two inputs of an adder 76 and the outputs of these two adders are connected to two inputs of an adder 77 whose output constitutes the phase-shifted output $S_{32}$. Each delay element delays the signal which passes through it over a delay time $T_E$ as defined above. FIG. 4 described above shows that the circuit diagram thus proposed is equivalent to that of FIG. 3, however, with the advantage that the number of multipliers is reduced.

The advantages of the filters described in FIGS. 3 and 4, or, generally, of those, whose functions are based on the two expressions (1) and (2) mentioned above result in the advantages that the amplitude-frequency response for the part of the filter supplying the reference output signal is equal to that for the part supplying the phase-shifted output signal on the one hand, and that a considerably shorter duration of the pulse response and a reduction of the costly components with respect to the filter of FIG. 2 is achieved. Such a filter allows for a simple calculation of the amplitude of a sinusoidal sampled signal. When the sample sequences $X_n$ and $Y_n$ appearing at the reference and phase-shifted outputs are mutually phase-shifted over $\pi/2$, the amplitude is equal to $(X^2_n + Y^2_n)^{1/2}$, while the square root can be extracted, for example, by means of a read-only memory.

Figure 5:
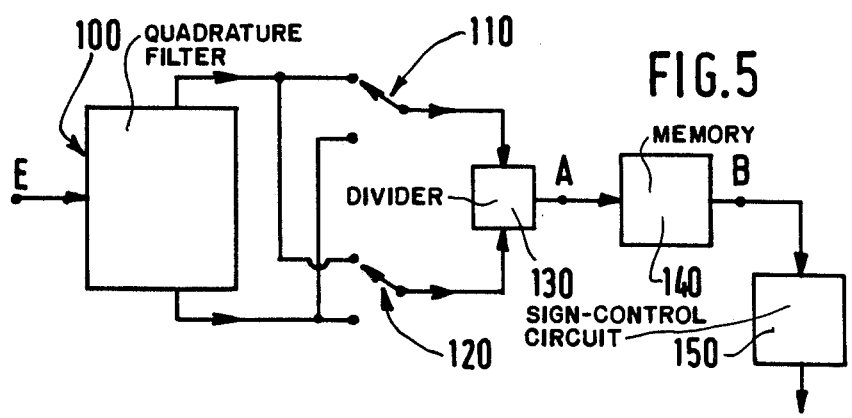
FIG. 5 shows an embodiment of a frequency-modulated digital signal demodulator incorporating a filter according to the invention.

In the case of a sinusoidal sampled signal such a quadrature filter allows of determining the instantaneous phase $\phi_n$ of a sample $X_n$ by calculating $\phi_n = \text{Arc tg}(X_n/Y_n)$. The divisions of $X_n$ by $Y_n$ provides the tangent of the instantaneous phase which by definition is independent of the amplitude of the sinusoidal signal. Thus the phase itself can be calculated with the aid of a table comprising the arc tangent function. As shown in FIG. 5 a quadrature filter 100 supplies samples $X_n$ and $Y_n$ at two outputs connected to two switches 110 and 120, a divider 130 (for dividing $X_n$ by $Y_n$ when $Y_n$ is larger than or equal to $X_n$, or for dividing $Y_n$ by $X_n$ in the opposite case, in accordance with the position corresponding to the position of the switches 110 and 120), and a memory 140 supporting the table for calculating the arc tangent function. The relationship between the tangent and the cotangent allows the memory 140 to be utilized even with $Y_n$ is less than $X_n$. The value $\phi_n$ is obtained with an indeterminacy of $\pm K\pi/2$, this indeterminacy being eliminated by a circuit 150 following the memory 140 and used for controlling the signs of $X_n$ and $Y_n$.

If A is the output of the divider 130 and B is the output of the memory 140, $A = |X_n/Y_n|$ if $|Y_n|$ is larger than or equal to $X_n$, or $A = |y_n/X_n|$ in the opposite case. The table eliminating the indeterminancy of the value $\phi_n$, with $s_1$, $S_2$, $S_3$ being the signs of $|X_n|$, $|Y_n|$ and $|X_n| - |Y_n|$ is as follows:

| $S_1$ | $S_2$ | $S_3$ | value of $\phi_n$ |
|---|---|---|---|
| + | + | + | $-B + \pi/2$ |
| $S_1$ | $S_2$ | $S_3$ | value of $\phi_n$ |
| + | − | + | $+B + \pi/2$ |
| − | + | + | $+B - \pi/2$ |
| − | − | − | $-B - \pi/2$ |
| + | + | − | $+B$ |
| + | − | − | $-B + \pi$ |
| − | + | − | $-B$ |
| − | − | − | $+B - \pi$ |

With the diagram of FIG. 5 values varying only between $+1$ and $-1$ are obtained at the output of the divider 130, therewith obviating any problem in connection with asymptotic values and maintaining a constant precision in the $-\pi$ to $+\pi$ radian range at the output of the memory 140.

Figure 6:
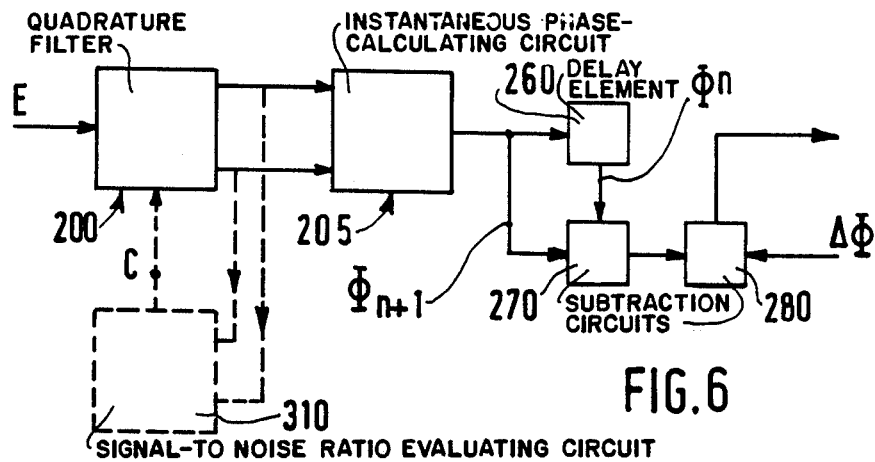
FIGS. 6 to 8 show modifications of such a demodulator

When $\phi_n$ and $\phi_{n+1}$ are the instantaneous phases of the two successive samples $X_n$ and $X_{n+1}$ of a frequency-modulated digital signal and if $\Delta\phi$ is the increment of the phase of the carrier of the modulated signal between the two samples, the digital demodulation of this signal can be realized by calculating the expression $\phi_{n+1} - \phi_n - \Delta\phi$, for example, in accordance with a demodulation diagram as shown in FIG. 6. In this Figure sample pairs $(X_n, Y_n)$, $(X_{n+1}, Y_{n+1})$, etcetera . . . at the output of a quadrature filter 200 represent the modulated signal which is present at the input of this filter. These samples, for example, $X_{n+1}$ and $Y_{n+1}$ in FIG. 6 are applied to a circuit 205 for calculating the instantaneous phase comprising the circuits 210, 220, 230, 240, 250 which are not shown because they are identical to the elements 110 to 150 of FIG. 5 and function in the same manner. A first subtraction circuit 270 receives at a first positive input the output signal $\phi_{n+1}$ from said circuit 205 and at a second negative input, the output signal $\phi_n$ determined by the circuit 205 in response to the presence of the preceding sample pair $X_n$, $Y_n$ at the output of the quadrature filter 200 in the course of the preceding calculation cycle. In order to synchronize the input signals of the circuit 270, the signal $\phi_n$ is delayed by one sampling period $T_E$ in a delay element 260. A second subtraction circuit 280 receives the signal $\phi_{n+1} - \phi_n$ at its positive input and $\Delta\phi$ at its negative input and supplies the demodulator output signal.

When the frequency-modulated signal is accompanied by noise which is non-negligible with respect to the signal, in a vectorial representation the vector resulting from the vectorial addition of the modulation signal and the noise can rotate about the origin. The result is a phase jump of the resulting vector of $\pm 2\pi$ radians in accordance with the sense of the vector rotation. The frequency demodulators are consequently characterized by a threshold below which a rapid degradation of the signal-to-noise ratio at the output is observed while the same ratio is reduced at the input.

Certain demodulators having an extended or increased threshold have the advantage of a threshold which is several decibels less than those obtained with other demodulators. An improvement of the threshold of the demodulator described hereinbefore can be obtained within the scope of the present invention by changing the coefficients of the quadrature filter as a function of the signal-to-noise ratio. As is shown in broken lines in FIG. 6 it is thus sufficient to provide a circuit 310 for calculating or estimating the signal-to-noise ratio at the output of the quadrature filter 200 and in parallel with the circuit 205 for calculating the instantaneous frequency.

The circuit 310 supplies a signal C which, as a function of the momentary signal-to-noise ratio, changes the coefficients of the quadrature filter, more precisely, which modifies these coefficients when the signal-to-noise ratio falls below a given threshold such, that the noise is reduced.

Figure 7:
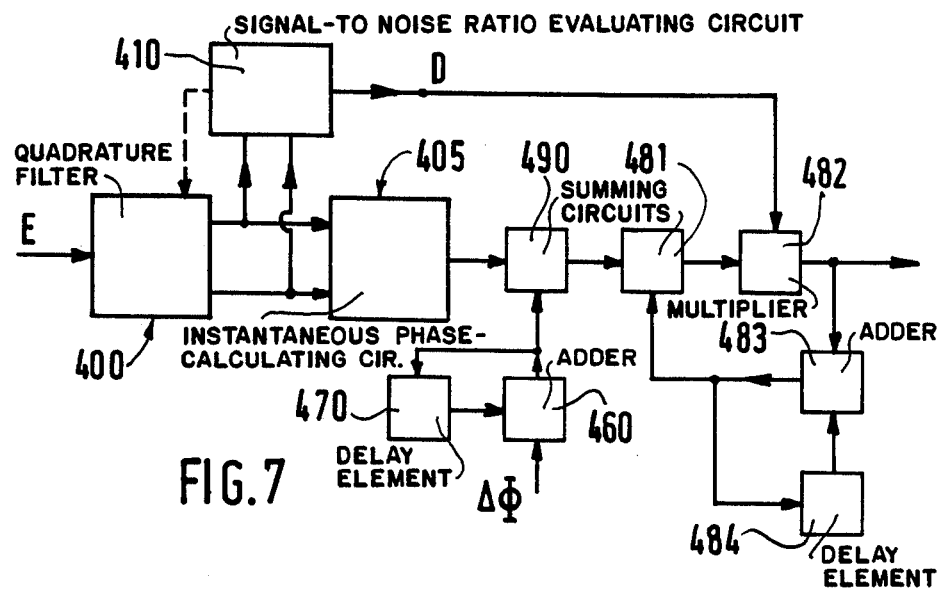

An improvement of the threshold of the described demodulator can also be obtained within the scope of the invention by the diagram shown in FIG. 7. The demodulator shown in this Figure comprises similarly as described before a quadrature filter 400 and a circuit 405 for calculating the instantaneous phase which circuit also comprises circuits 410 to 450 which are not shown because they correspond with the circuits 110 to 150 already mentioned and function in the same manner. An accumulator comprising an adder 460 and a delay element 470 (the output signal from the adder 460 being supplied thereto and delivering a signal to one of the inputs of the adder 460 while the other input of the adder 460 receives the phase increment $\Delta\phi$) permits restoring the phase of the carrier to a constant. The output signal from the accumulator is applied to a negative input of a summing circuit 490 the other positive input of which receives the output signal from the circuit 405 for calculating the instantaneous phase and whose output signal is applied to a recursive filter.

This recursive filter comprises a summing circuit 481 a positive input of which receives the output signal from the summing circuit 490 and the output of which is connected to a multiplier 482. The output of this multiplier, which constitutes the output of the demodulator which is thus a carrier for the demodulated signal, is connected to an accumulator comprising an adder 483 and a delay element 484 and whose output signal is applied to a negative input of the summing circuit 481. The other input of the multiplier 482 receives the output signal D from a circuit 410 for evaluating the signal-to-noise ratio, which, as described hereinbefore, is arranged in parallel with the two inputs of the circuit 405 for calculating the instantaneous phase.

The demodulator of FIG. 7 operates as follows. As described hereinbefore, the instantaneous phase $\phi_n$ of a sample is calculated with the aid of the quadrature filter and other elements succeeding it (see FIG. 5). The accumulator (483, 484) permits restoring the phase of the carrier to a constant. The summing circuit 481 thus permits suppressing the carrier at a constant in the sequence of samples $\phi_n$ and the recursive filter which succeeds it functions as a phase-locked loop. This loop, whose output supplies the demodulated signal, is locked on the modulated signal transposed in the baseband.

FIG. 6 (with the circuit 310) and FIG. 7 illustrate the two methods of improving the threshold, which methods each use a narrowing of the passband for reducing the noise affecting the demodulated signal. Certain distortions are introduced, however tests clearly show that in spite of this these two methods improve the subjective receiver quality. These methods can be combined by providing, in FIG. 7, a feedback coupling from the output of the circuit 410 for evaluating the signal-to-noise ratio to the quadrature filter 400, which is intended for the control of the modification of the quadrature filter coefficients when the said ratio becomes below a given threshold (this connection is shown in broken lines in FIG. 7).

Figure 8:
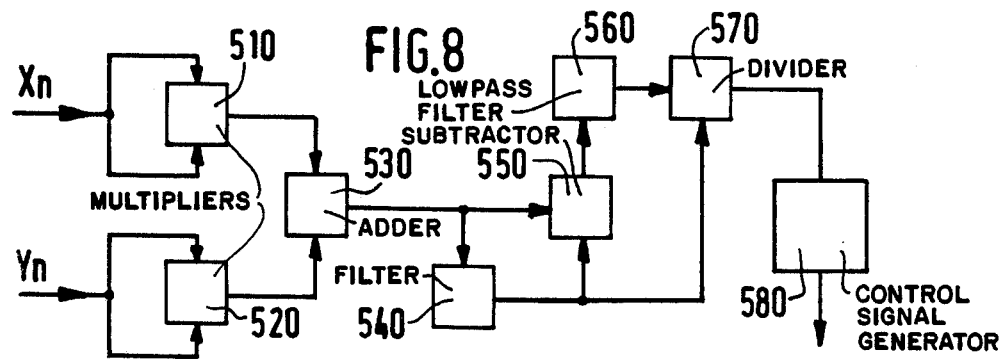

The circuit 410 for evaluating the signal-to-noise ratio utilizes the samples X and Y for determining the square value of the amplitude of the useful signal and for obtaining an estimation of the noise power. A preferred embodiment of this circuit 410 is shown in FIG. 8. Two multipliers 510 and 520 and an adder 530 calculate from the samples $X_n$ and $Y_n$ the square wave of a signal module which comprises a certain amount of noise, to be suppressed. A filter 540 suppresses the noise occurring around an average of zero in the output signal of the adder 530. An output of the adder 530 is coupled to an input of subtractor 550 and through the filter 540 to another input of this subtractor 550, calculating the absolute value of the difference between the square value of the noiseless signal module (after filtering) and supplies a signal which is representative of the square value of the noise. A lowpass filter 560 arranged at the output of the subtractor 550 supplies a signal which is representative of the average power of the noise and a divider 570 for dividing the output signal of the filter 540 by the latter output signal from the filter 560 supplies a signal expressing the (demodulated) signal-to-noise ratio. A table 580 which is identical to that given hereinbefore (determination of the value $\phi_n$ as a function of $S_1$, $S_2$, $S_3$) thus provides the control signal C and/or D as a function of the selected thresholds.

I claim:

1. A frequency modulated digital signal demodulator comprising a digital quadrature filter comprising an odd number of n delay elements arranged in cascade, each delaying an input signal sample X by a value $T_E=1/F_E$, where $F_E$ is the sample frequency of the input signal samples, a plurality of multipliers each multiplying its input signal by a given coefficient C, and means for connecting said multipliers with said delay elements to a first and a second summing circuit, such that the output signal $S_{31}$ of the first summing circuit equalizes:
   $\Sigma C_{n-1} X_{i+1}$, where i=1,,3,5 . . . n and the output signal $S_{32}$ of the second summing circuit equalizes:
   $\Sigma C_i X_{i+1}$, where i=0,2,4, . . . n−1 $X_{n+1}$ being the sample present at the filter input and $X_{n+1-i}$ being the sample being delayed $i.T_E$, the demodulator comprising at the outputs of the first and second summing circuits a circuit for calculating the instantaneous phase $\phi_n$ of successive signal samples, and a circuit for evaluating the signal to noise ratio, which is connected to a control circuit supplying a control signal for modifying the coefficients of the quadrature filter such that its passband is narrowed when said ratio drops below a given threshold.

2. A demodulator as claimed in claim 1, further comprising a third summing circuit and an accumulator which comprises an adder, an output thereof constituting an output of the accumulator and being fed back through a delay element to an input thereof, a further input of said adder receiving a phase increment $\Delta\phi$, characterized in that the output of the circuit for calculating the instantaneous phase is connected to the positive input of said third summing circuit which receives, at its negative input, the output signal from said accumulator, the output of said third summing circuit being connected to the input of a recursive filter, whose output supplies the demodulated signal, and in that the circuit for evaluating the signal-to-noise ratio comprises means for supplying a control signal for modifying the loop gain of the recursive filter such that the passband of the recursive filter is narrowed when said ratio drops below a given threshold.

3. A demodulator as claimed in claim 2, characterized in that the recursive filter comprises a fourth summing circuit, a positive input of which receives the output signal from the third summing circuit and whose output signal is applied to a multiplier, a further accumulator, the output signal of said multiplier being applied to said further accumulator whose output signal is returned to a negative input of said fourth summing circuit, the other input of the multiplier being connected to the output of the circuit for evaluating the signal-to-noise ratio.

4. A demodulator as claimed in claim 2 or 3, characterized in that it comprises a feedback coupling from the output of the circuit for evaluating the signal-to-noise ratio to the quadrature filter for allowing for the modification of the coefficients of the quadrature filter when the said ratio falls below a given threshold.

5. A demodulator as claimed in claim 2 or 3, characterized in that the circuit for evaluating the signal-to-noise ratio comprises a circuit for calculating the square value of the amplitude of a signal sample, being connected to a filter for suppressing noise, delivering the square value of the noiseless signal sample, and to a subtractor, an output of said filter also being connected to said subtractor for mutually subtracting said square values and for supplying a signal, which is representative of the noise square value, to a lowpass filter filtering the mean power of said noise square value, also comprising a divider at the outputs of both said filters for supplying a signal representing the signal-to-noise ratio, and a circuit connected to the output of said divider for providing the beforementioned control signal.

* * * * *